United States Patent [19]
Sinsheimer et al.

[11] Patent Number: 6,027,346
[45] Date of Patent: Feb. 22, 2000

[54] MEMBRANE-SUPPORTED CONTACTOR FOR SEMICONDUCTOR TEST

[75] Inventors: Roger Sinsheimer, Petaluma; Vladan Temer; Dave Teglia, both of Santa Rosa, all of Calif.

[73] Assignee: Xandex, Inc., Petaluma, Calif.

[21] Appl. No.: 09/107,040

[22] Filed: Jun. 29, 1998

[51] Int. Cl.$^7$ .................................................. H01R 9/09
[52] U.S. Cl. .............................................. 439/66; 439/67
[58] Field of Search .................................. 439/66, 91, 67, 439/74, 70; 29/874

[56] References Cited

U.S. PATENT DOCUMENTS

| | | | |
|---|---|---|---|
| 3,596,228 | 7/1971 | Reed et al. | 339/59 |
| 3,634,807 | 1/1972 | Grobe et al. | 439/50 |
| 4,298,436 | 11/1981 | Thomas | 204/15 |
| 4,415,403 | 11/1983 | Bakewell | 156/634 |
| 4,707,657 | 11/1987 | Boegh-Petersen | 439/66 |
| 4,737,112 | 4/1988 | Jin et al. | 439/66 |
| 4,932,883 | 6/1990 | Hsia et al. | 439/66 |
| 5,109,596 | 5/1992 | Driller et al. | 439/66 |
| 5,118,299 | 6/1992 | Burns et al. | 439/74 |
| 5,119,111 | 6/1992 | Thomas et al. | 346/76 |
| 5,163,834 | 11/1992 | Chapin et al. | 439/66 |
| 5,430,614 | 7/1995 | Difrancesco | 439/66 |
| 5,500,280 | 3/1996 | Yamazaki et al. | 428/220 |
| 5,632,631 | 5/1997 | Fjelstad et al. | 439/82 |
| 5,759,047 | 6/1998 | Brodsky et al. | 439/66 |
| 5,785,538 | 7/1998 | Beaman et al. | 439/91 |
| 5,812,378 | 9/1998 | Fjelstad et al. | 361/769 |
| 5,829,988 | 11/1998 | McMillan et al. | 439/70 |
| 5,855,063 | 1/1999 | Schreiber et al. | 29/874 |

OTHER PUBLICATIONS

Abstract entitled, "Shaped Elastometric Interposer for Large Area Array Connectors," Research Disclosure, No. 324, Kenneth Mason Publications, Ltd., Apr. 1991, 1 p.

Abstract entitled, "Elastometric Interposer Using Wires in Elastomer Pad with Controlled Compliance, " Research Disclosure, No. 324, Kenneth Mason Publications, Ltd., Apr. 1991, 1 p.

Abstract entitled, "Elastometric Interposer Using Film–Supported Metal Conductors," Research Disclosure, No. 324, Kenneth Mason Publications, Ltd., Apr. 1991, 1 p.

Abstract entitled, "High Density Area Array Connector," Research Disclosure, No. 324, Kenneth Mason Publications, Ltd., Apr. 1991, 1 p.

Abstract entitled, "Method of Testing Chips and Joining Chips to Substrates, " Research Disclosure, No. 322, Kenneth Mason Publications, Ltd., Feb. 1991, 1 p.

*Primary Examiner*—Neil Abrams
*Assistant Examiner*—Hae Moon Hyeon
*Attorney, Agent, or Firm*—Beyer & Weaver, LLP

[57] ABSTRACT

A method and apparatus are described for providing electrical connection between a first array of contact points and a second array of contact points via a layer of anisotropically conductive material in contact with the second array of contact points. A membrane is provided having a plurality of apertures therein for receiving the first array of contact points. A plurality of electrical contacts is also provided, each of the electrical contacts being coupled to the membrane and at least partially in registration with one of the plurality of apertures. The electrical contacts are for contacting the first array of contact points through the plurality of apertures. The electrical contacts are also for electrically connecting to the second array of contact points via the layer of anisotropically conductive material. Each of the electrical contacts is operable to move substantially independently of adjacent electrical contacts.

18 Claims, 9 Drawing Sheets

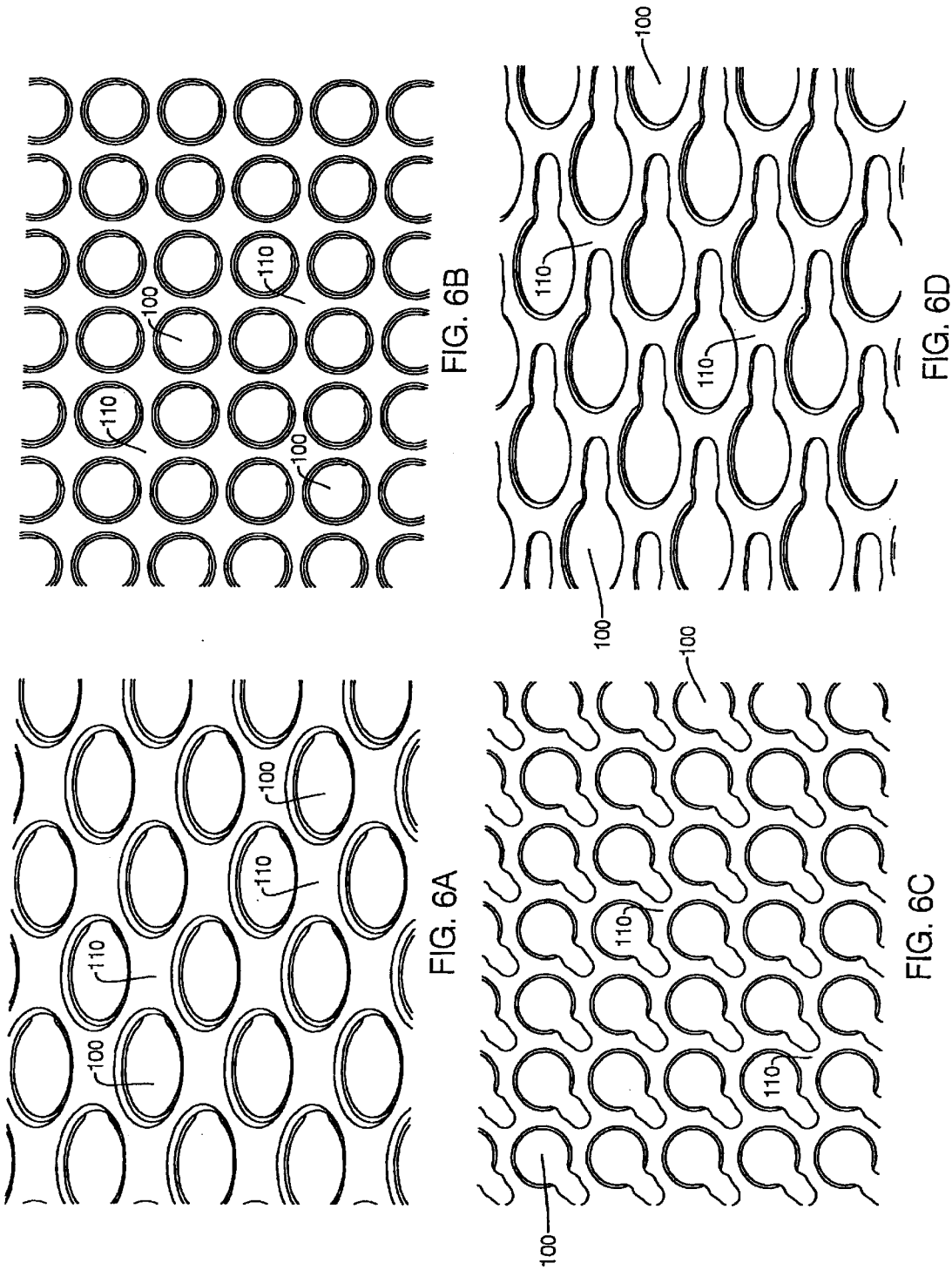

MEMBRANE-SUPPORTED CONTACTOR FOR SEMICONDUCTOR TEST

BACKGROUND OF THE INVENTION

This present invention relates to the testing of semiconductor devices. More specifically, the present invention provides methods and apparatus for creating a temporary electrical connection with a semiconductor device for the purpose of testing the functionality thereof.

The common practice of semiconductor manufacturers is to 100% test their products prior to shipping them to their customers. This testing is performed both at the wafer level, i.e., "wafer sort", where the semiconductors are still in the form in which they were manufactured, and at the package level, i.e., "package sort", after the wafer has been sawn up and the individual chips have been mounted into their protective carriers. To perform these tests, a temporary, non-destructive electrical connection is formed between the semiconductor device and the testing apparatus. The device used to perform this function is generically known as a "contactor".

Individuals with ordinary skill in the art will be familiar with the various types of wafer probe cards and packaged device contactors employed for this purpose. One class of contacting devices is based upon the use of a deformable plastic membrane. A contactor based upon this general concept was disclosed in U.S. Pat. No. 3,596,228, the entire specification of which is incorporated herein by reference for all purposes. This class of contactor holds the promise of a device which is relatively easy to manufacture, and a variety of technologies have emerged which reference this pioneering conceptual work.

On the other hand, the conventional non-membrane style contactor requires a great deal of precision handwork to assemble, requiring expensive, highly skilled direct labor in the creation of the assembly. For example, contactors which employ individual probe needles require precise mechanical parts and skilled assembly labor.

Inherent in the concept of the membrane contactor is that it is to be manufactured using batch-process methods. Conceptually this approach offers the hope of relatively low cost, uniformity, and accuracy in its physical structure. Unfortunately, in practice many companies have found membrane contactors expensive to manufacture in the relatively small quantities (when compared to consumer goods) required by the semiconductor industry.

Another problem with current membrane technologies arises from the way that the membrane is typically utilized. That is, according to the conventional solution, the contact points which interact with the semiconductor are firmly affixed to the flexible membrane. The disadvantage of such a structure will become evident with reference to the following discussion.

The functional concept underlying the use of the flexible membrane is to permit the contacts to move relative to each other in the Z-axis and to thereby accommodate the variability in the heights of the contact points on the device to be tested. The membrane also provides a substrate upon with the contact features are manufactured so that the relative X-Y alignment of the individual contact features is maintained. Finally, the membrane provides a substrate upon which connections between the contact points and the supporting Power Wiring Board ("PWB") can be formed.

In the ideal case, the contact points would be completely free-floating in the Z-axis, as the height of contact points on many real-world semiconductors and semiconductor packages are highly variable. When the contact points on semiconductors were relatively far apart, i.e., when the flexible membrane concept was first introduced, there was sufficient contact-point-to-contact-point Z-compliance to allow for real-world variations from ideal co-planarity.

However, as the semiconductor industry has reduced the size of semiconductor devices and simultaneously increased the number of contact points on a given semiconductor chip, the available distance or pitch between the contact points has been correspondingly reduced. Unfortunately, the inherent compliance of the membrane has not been sufficient to deal with this new challenge. An additional source of difficulty has arisen with the advent of Ball Grid Array (BGA) device packages. The BGA concept introduces contact point height variations which are orders of magnitude worse than those encountered when contacting semiconductors directly. That is, a height difference of 8 thousandths of an inch is tolerated where the typical ball height is only 30 thousandths of an inch! This is more than a 25% allowable variation!

Thus, even though conventional membrane contactors have historically been appropriate for a variety of grid array devices, e.g., BGA, land grid array (LGA), and Flip-Chip or Direct Chip Attach (DCA), the distance between contact points on state of the art devices has been reduced to the point at which sufficient Z-compliance is not possible for the conventional designs. Moreover, conventional independent suspension solutions such as, for example, pogo pins, are also decreasing in efficacy. Not only are they considerably more complex and expensive to manufacture than membrane style contactors, as contact pitches decrease the difficulty and expense of manufacturing them increases dramatically.

It is therefore desirable to provide a membrane contactor design which utilizes the advantages inherent in membrane contactors while providing an improved Z-compliance for the contact features which is appropriate to the variability and density of current devices.

SUMMARY OF THE INVENTION

According to the present invention a membrane contactor is provided having an array of contact points with greatly improved Z-compliance. Each contact point is largely cut away from the surrounding support material, allowing it to move in a substantially isolated fashion from its neighbor contacts. This is accomplished by first forming the contacts on the membrane and then forming holes in the membrane in registration with each contact. A portion of each contact remains connected to the membrane and the remainder of the contact essentially pivots about the connection point.

The contacts and the holes in the membrane are arranged to conform to an arrangement of contacts on a particular device type to be tested. Although regularly spaced grid arrays are particularly amenable to designing a contactor according to the present invention, it will be understood that custom designs for irregularly spaced contacts may also be implemented according to the techniques described herein.

The contacts from the DUT are received by the holes in the membrane and contact is made with the membrane contacts through the holes with each of the membrane contacts pivoting about its connection point with the membrane according to the pressure exerted by the DUT contact. Because the majority of each membrane contact is not restricted by the membrane, its movement has very little effect on adjacent membrane contacts regardless of the height variation between any two adjacent DUT contacts.

In addition, as the membrane contact pivots, its lateral movement relative to the DUT contact abrades the surface of the DUT contact. This is a desirable result for BGA packages. With BGAs, the surface of the balls of the array are typically coated with lead oxide and tin oxide, which are nonconductive. Therefore, to establish a sufficient electrical connection for testing, the surface of the balls must either be scrubbed or pierced. However, some in the industry tend to avoid techniques which substantially deform the surface of the balls such as, for example, piercing. The abrading action of the membrane contacts of the present invention performs the function of removing the nonconductive impurities from the surface of the ball contacts thus establishing a reliable electrical contact without significantly deforming the surface of the balls.

Thus, the present invention provides methods and apparatus for providing electrical connection between a first array of contact points and a second array of contact points via a layer of anisotropically conductive material in contact with the second array of contact points. A membrane is provided having a plurality of apertures therein for receiving the first array of contact points. A plurality of electrical contacts is also provided, each of the electrical contacts being coupled to the membrane and at least partially in registration with one of the plurality of apertures. The electrical contacts are for contacting the first array of contact points through the plurality of apertures. The electrical contacts are also for electrically connecting to the second array of contact points via the layer of anisotropically conductive material. Each of the electrical contacts is operable to move substantially independently of adjacent electrical contacts.

A further understanding of the nature and advantages of the present invention may be realized by reference to the remaining portions of the specification and the drawings.

BRIEF DESCRIPTION OF THE DRAWINGS

FIGS. 6A–6D show top isometric, plan, bottom and bottom isometric views, respectively, of the embodiment of FIGS. 1–4;

DESCRIPTION OF SPECIFIC EMBODIMENTS

Figure 1:
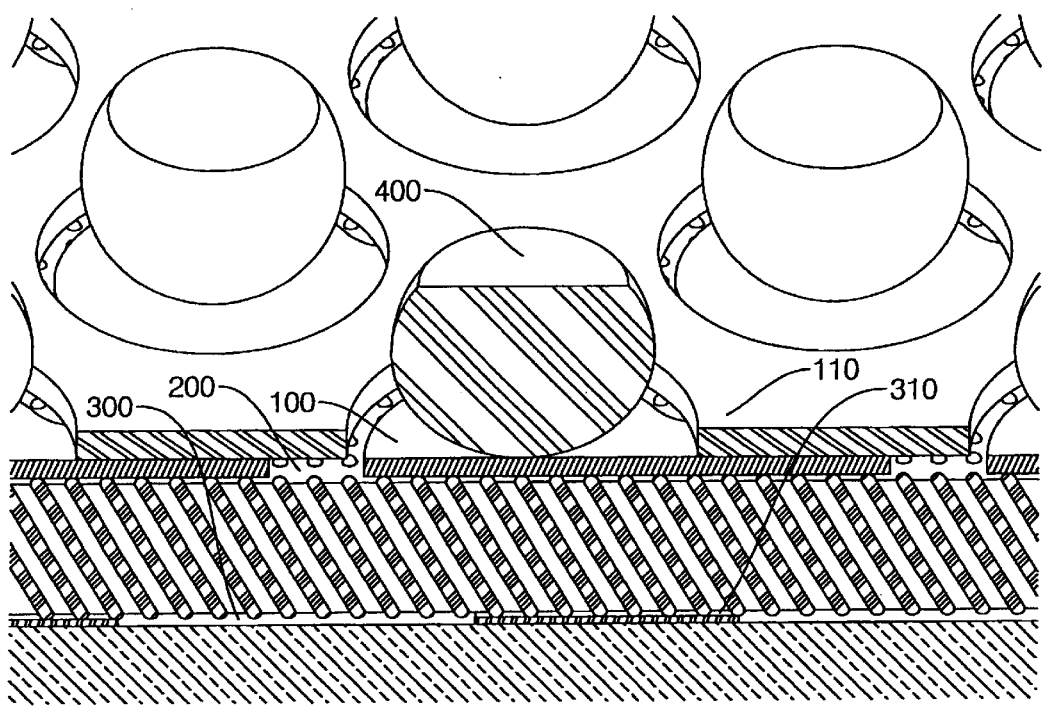
FIG. 1 shows a cross-sectional perspective view of a specific embodiment of this invention.
Figure 2:
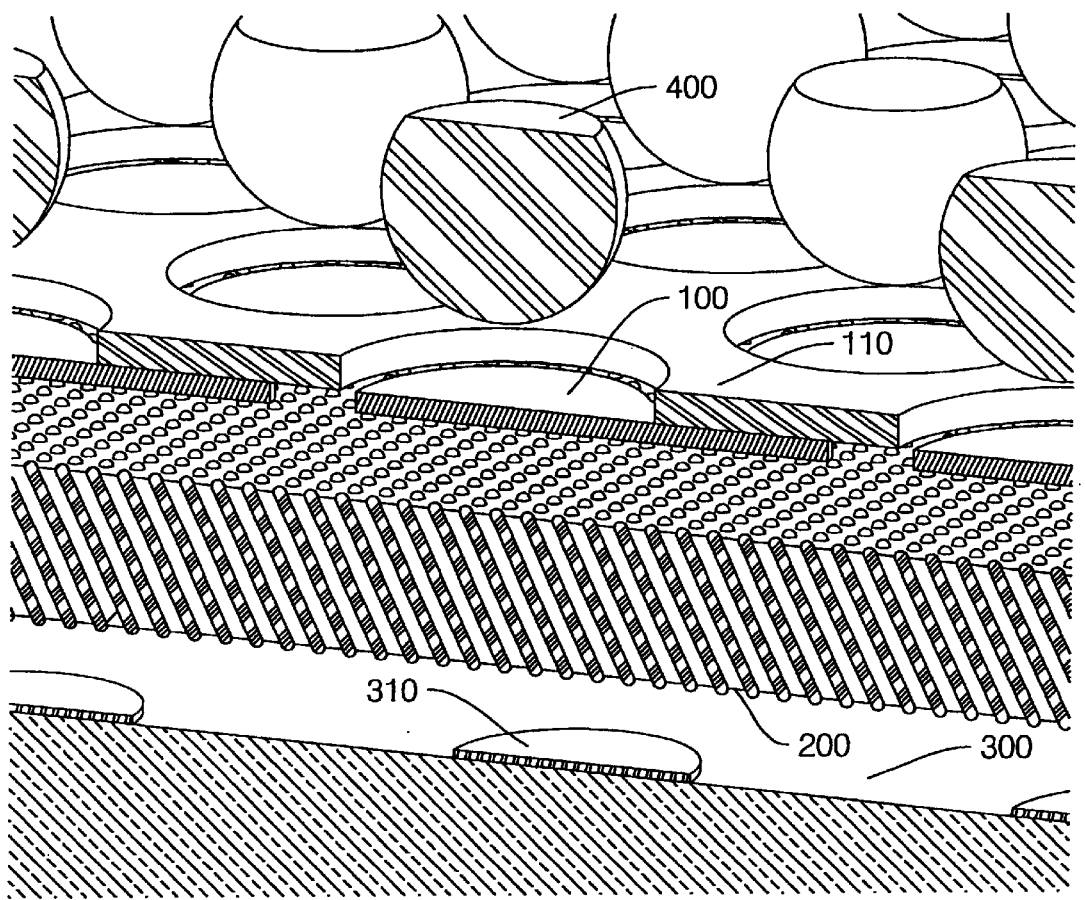
FIG. 2 shows an exploded perspective view of the embodiment of FIG. 1.
Figure 3:
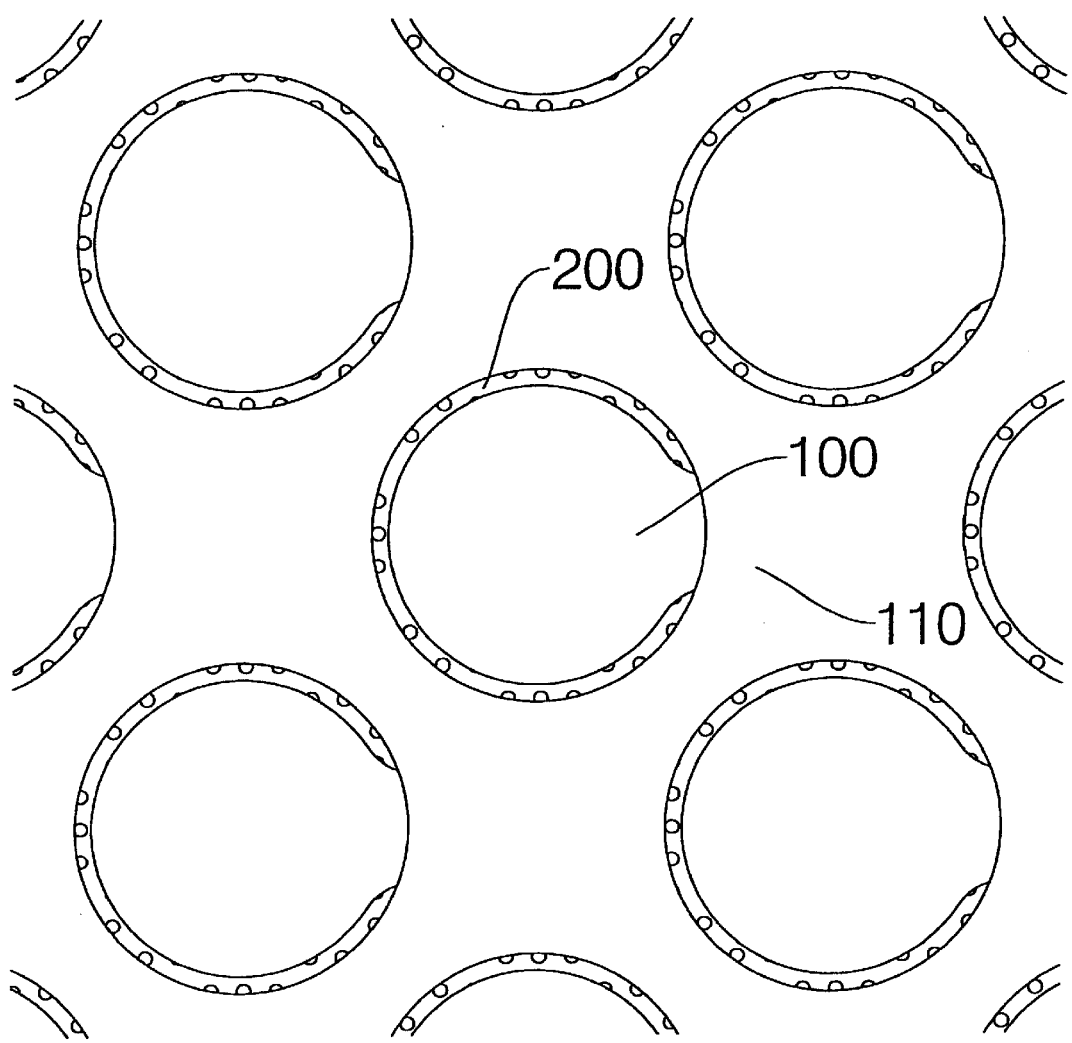
FIG. 3 shows a top view of the embodiment of FIG. 1, "top" referring to the side interfacing with a semiconductor package.
Figure 4:
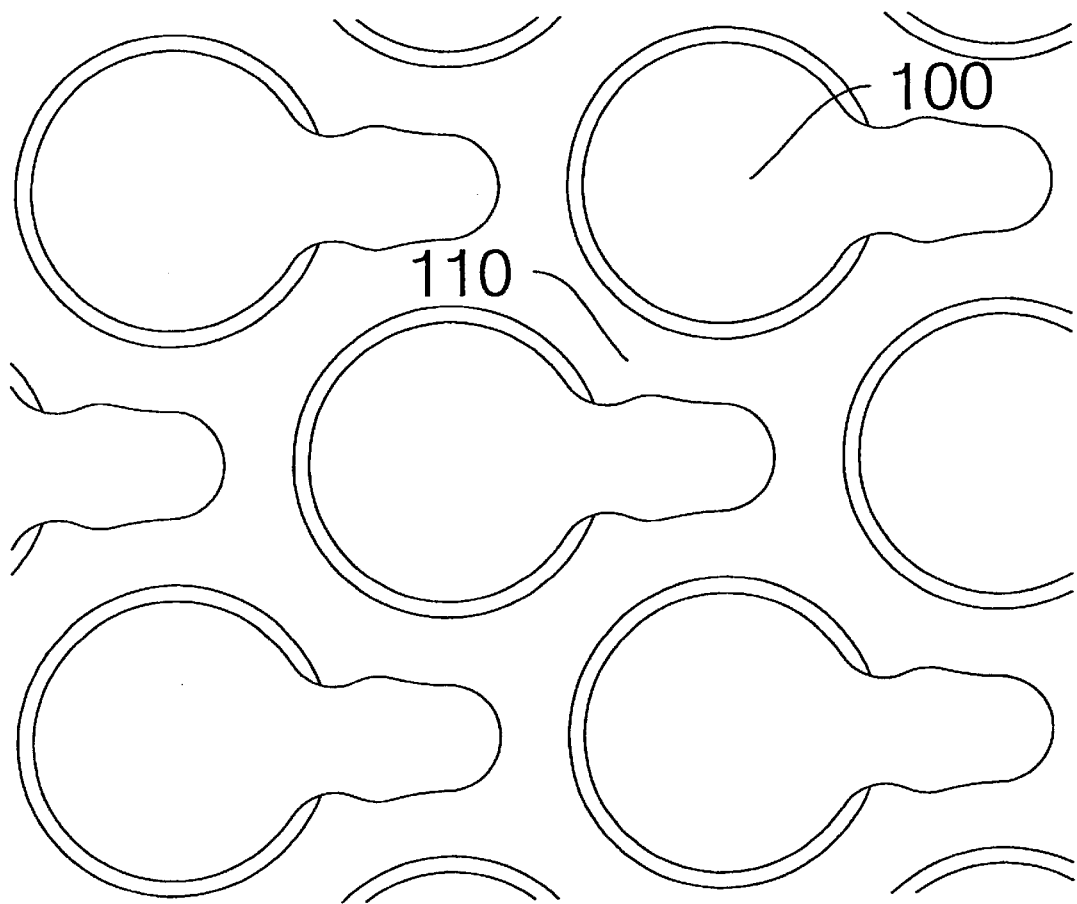
FIG. 4 shows a bottom view of the embodiment of FIG. 1, "bottom" referring to the side interfacing with an anisotropically conductive layer.

FIGS. 1 through 4 show various views of a specific embodiment of this invention. A polyimide membrane 110 has a plurality of apertures through which Ni—Co membrane contacts 100 may be contacted by contact features 400 which are part of a semiconductor package (not shown). Membrane contacts 100 are in intimate electrical contact with an anisotropically conductive elastomer 200 which is, in turn, in intimate electrical contact with contacts 310 on tester interface board 300. When contact features 400 on the semiconductor package are pressed against electrical contacts 100, an electrical circuit is completed between the semiconductor package and tester interface board 300. The membrane assembly, elastomer 200 and interface board 300 are all aligned in a contactor housing (not shown) according to well known techniques. According to specific embodiments of the invention, membrane 110 and contacts 100 are optimized for contact with the ball contacts of a BGA package.

The function of membrane 110 is two-fold. It provides a surface for the formation of contacts 100, and it maintains the relative X-Y position of the many electrical contacts needed to accommodate the entire complement of contacts needed for a typical semiconductor package. The formation of Ni—Co contacts 100 on membrane 110 may be accomplished according to any of a variety of techniques known to persons of skill in the art. Exemplary processes which may be adapted for the formation of such structures are described in U.S. Pat. Nos. 4,298,436, 4,415,403, and 5,119,111 the entire specifications of which are incorporated herein by reference for all purposes. Moreover, the structure combining the contacts on the membrane may be obtained from the Metrigraphics division of Dynamics Research Corporation located in Wilmington, Mass.

According to specific embodiments of the invention, anisotropically conductive elastomer 200 may be implemented using materials described in U.S. Pat. Nos. 5,500,280 and 4,737,112 the entire specifications of which are incorporated herein by reference for all purposes. Elastomer 200 provides both a means of conducting the electrical signal from the membrane contacts of the present invention to a supporting circuit board, and an elastic, giving support for the contacts.

The size of the members of this assembly may be scaled to match the spacing of the semiconductor package's contact points. According to a specific embodiment, where the spacing is 1.27 mm (0.050 inches), membrane 110 is approximately 50 microns (0.002 inches) thick, and electrical contacts 100 are approximately 33 microns (0.0013 inches) thick. As the pitch between the contacts is reduced, this proportion will likely remain substantially constant, the membrane dimensions reducing in approximately linear fashion with the contact pitch.

According to a specific embodiment of the invention, electrical contacts 100 are formed on membrane 10 using electroforming technology. As mentioned above and as described in the referenced patents, a variety of electroforming techniques are well known in the art. In addition, there are a large variety of materials to choose from for contacts 100. According to a specific embodiment, contacts 100 comprise a nickel-based compound such as, for example, nickel-cobalt (Ni—Co). According to various embodiments, the apertures in the membrane 110 are chemically etched or laser ablated.

Figure 5A:
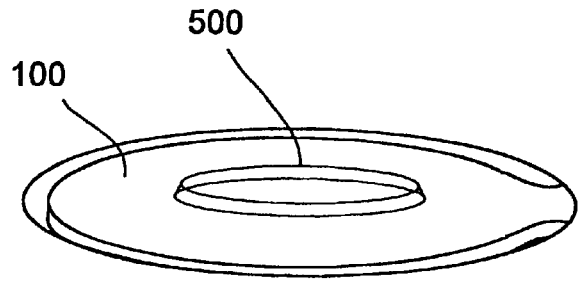
FIGS. 5A–5C show specific embodiments of pressure concentrating features on membrane contacts.
Figure 5B:
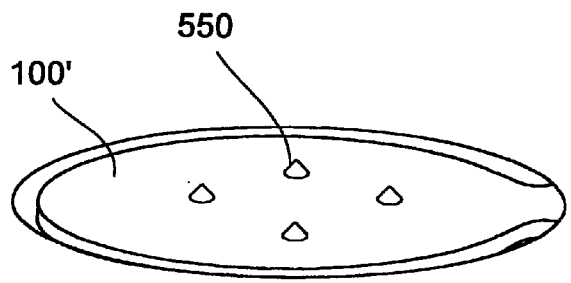
Figure 5C:
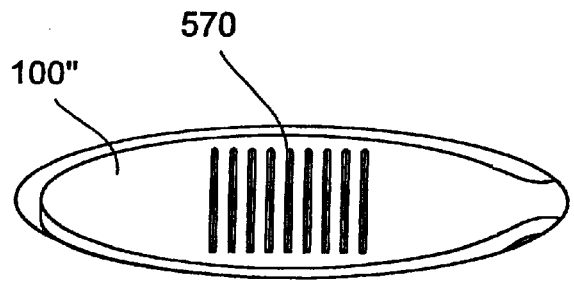
Figure 7A:
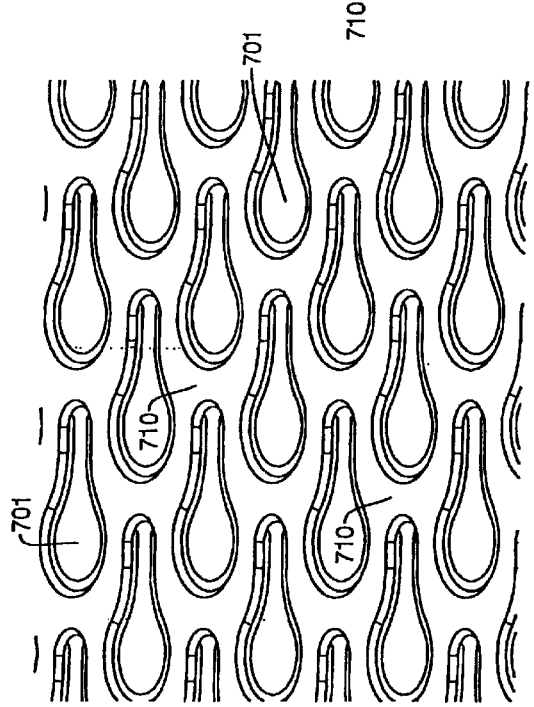
FIGS. 7A–7D show top isometric, plan, bottom and bottom isometric views, respectively, of an alternate embodiment of the invention.
Figure 7B:
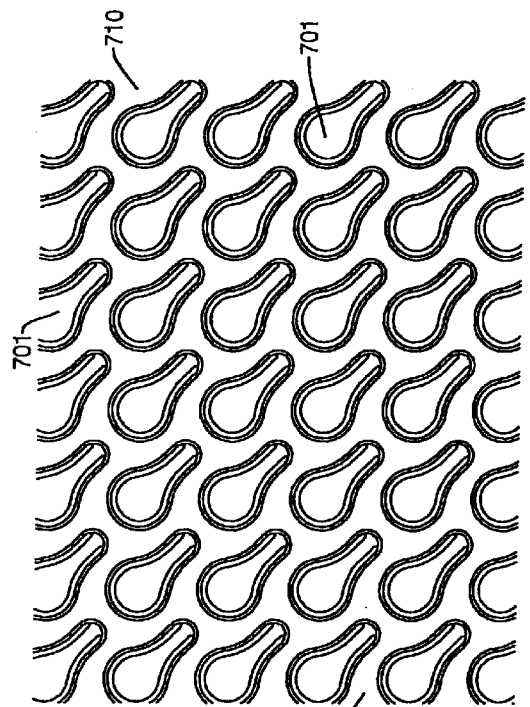
Figure 7C:
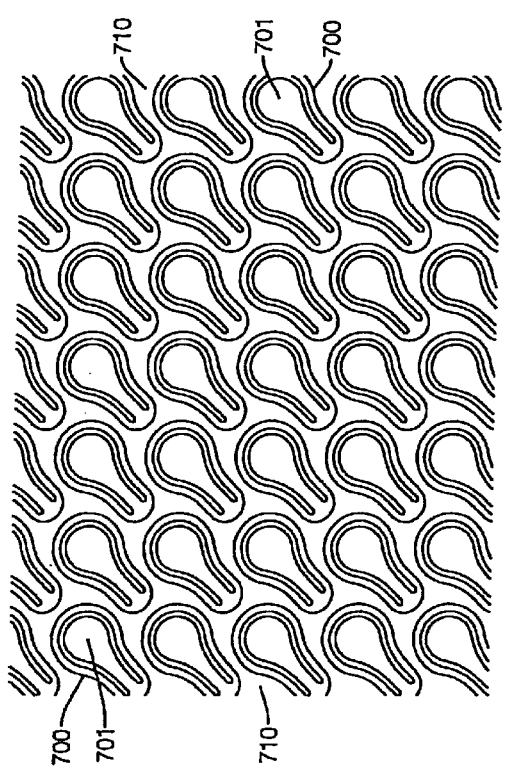
Figure 7D:
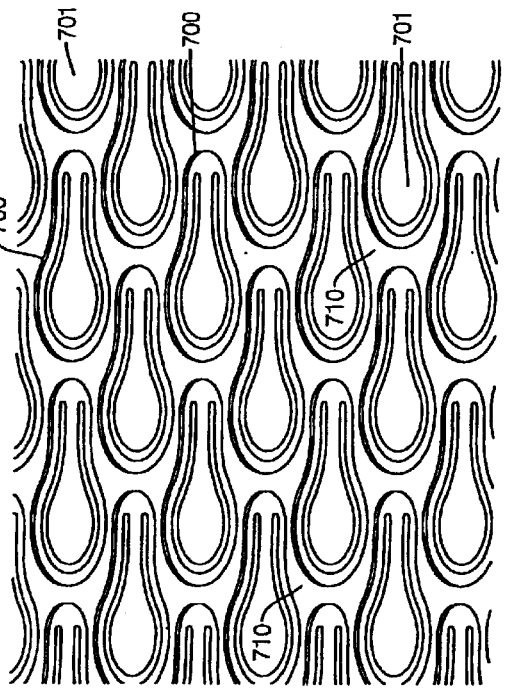
Figure 8B:
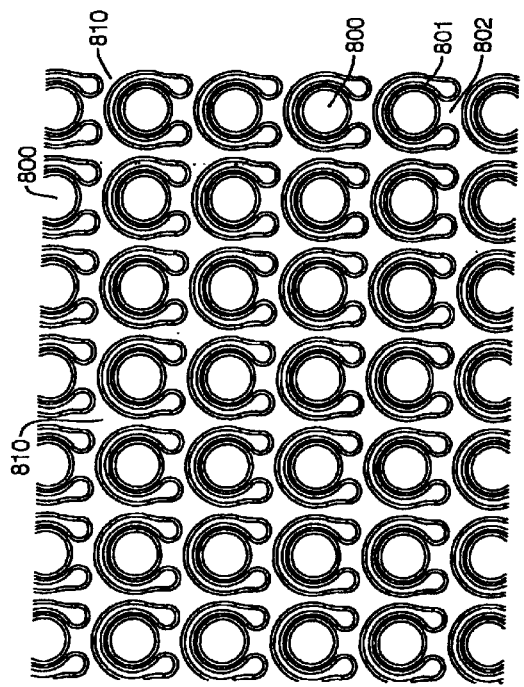
FIGS. 8A–8D show top isometric, plan, bottom and bottom isometric views, respectively, of another alternate embodiment of the invention.
Figure 8D:
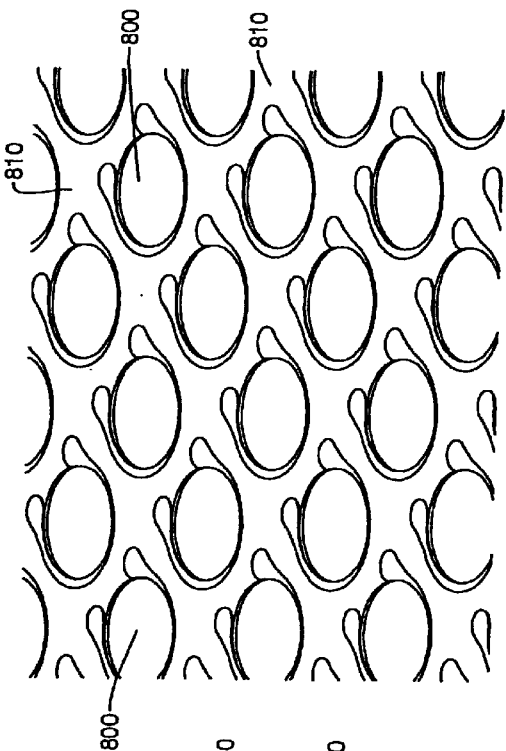
Figure 8A:
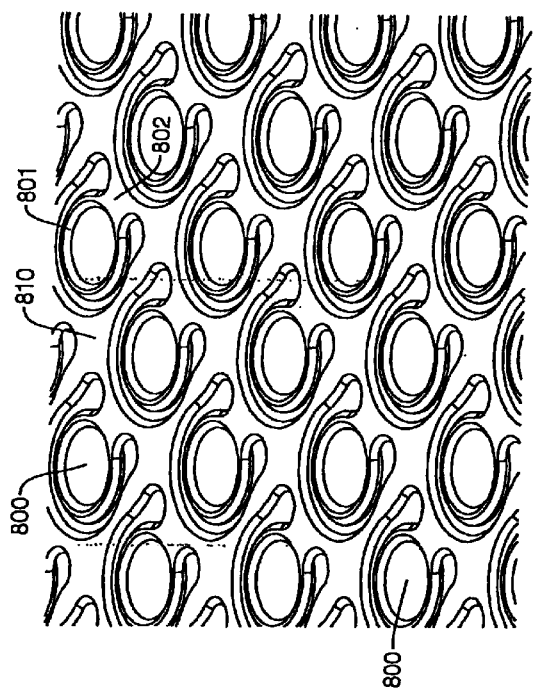
Figure 8C:
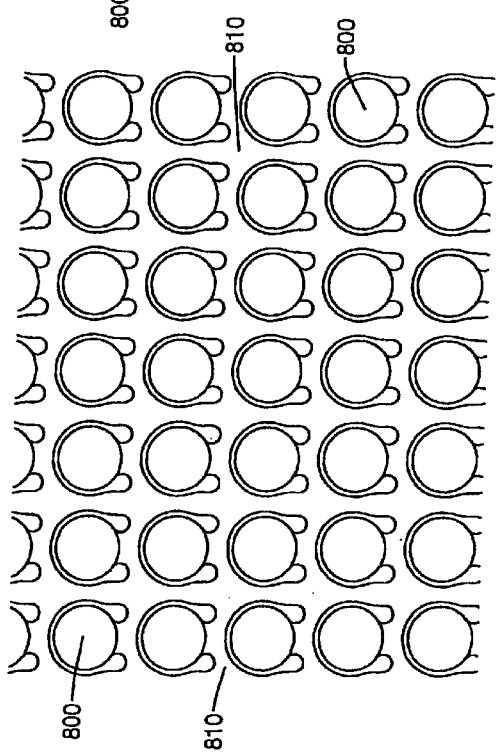

As mentioned above, the condition of the surfaces of the contacts of the semiconductor device to be tested may present obstacles to the formation of reliable electrical connections. Therefore, according to specific embodiments of the invention, pressure-concentrating features are provided on the face of the membrane contacts. According to a specific embodiment of the invention, before the membrane contacts are formed on the membrane, concave features are formed in the membrane at the positions where the contacts are to be formed. When the contacts are subsequently formed the concave features in the membrane are filled with the formed contact material. When the membrane is removed (e.g., etched or ablated) from the contact location, convex features on the surfaces of the contacts are exposed which correspond to the concave features formed in the membrane. As will be understood, the nature of the structures thus formed on the contact surface varies according to its intended use. FIGS. 5A and 5B show pressure-concentrating features according to two different embodiments of the invention. FIG. 5A shows a ring structure 500 on the surface of contact 100. FIG. 5B shows a plurality of pointed conical structures 550 on the surface of contact 100'. FIG. 5C shows a plurality of parallel linear structures 570 on the surface of contact 100". It will be understood how such features may improve the reliability of connections with, for example the ball contacts of a BGA package.

FIGS. 6A–6D show four different views of the embodiment described above with reference to FIGS. 1–4.

FIGS. 7A–7D show an alternative embodiment of the invention in which the shape of contacts 700 and the removal pattern of membrane 710 are different from the previously described embodiment. According to this embodiment, the perimeter of each contact 700 remains connected to membrane 710. The independent movement of each contact is provided by an inner portion 701 of each contact which is partially separated from the perimeter of contact 700 as shown.

Figure 9:
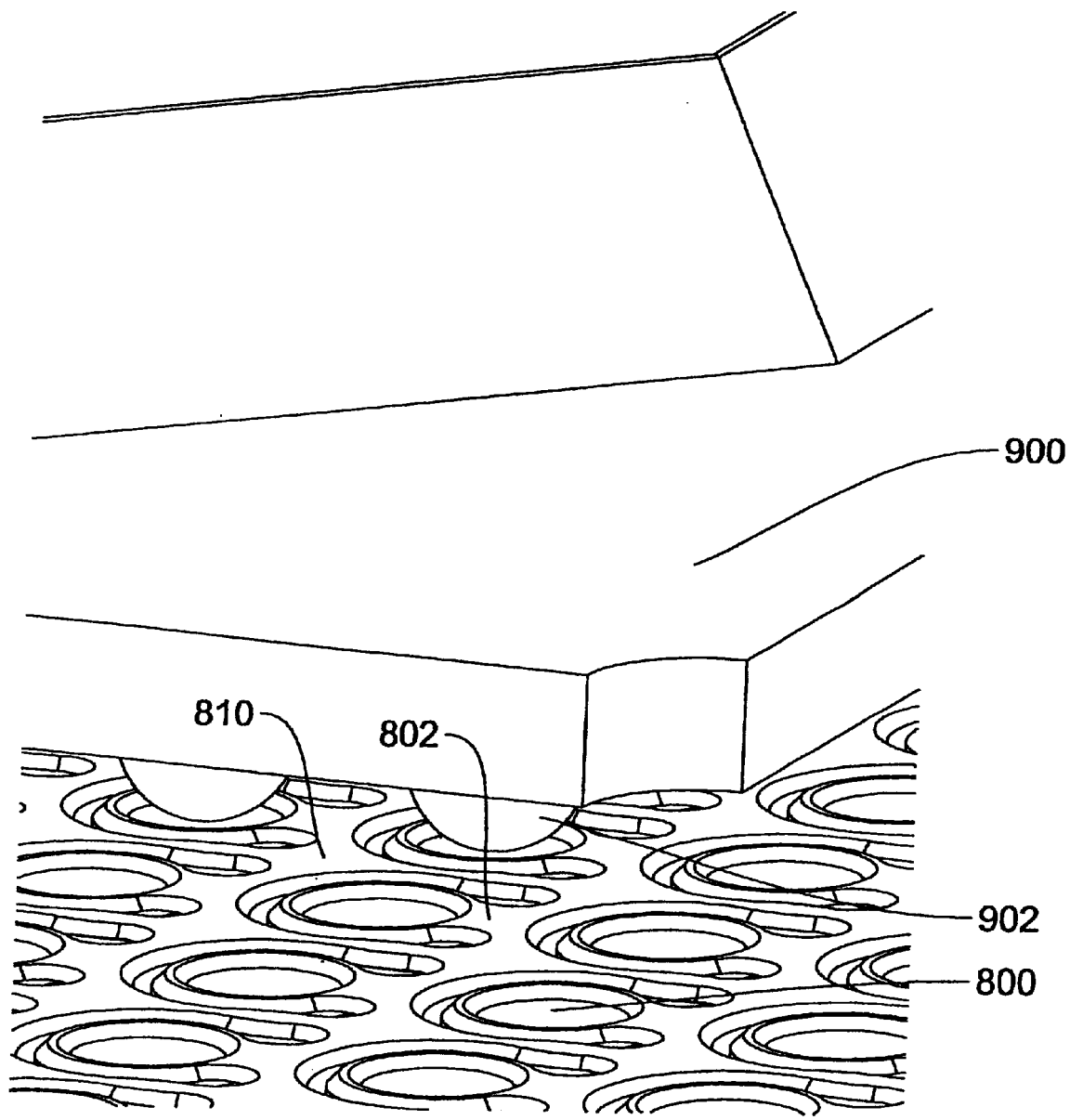
FIG. 9 illustrates the interface between a BGA package and the embodiment of FIGS. 8A–8D.

FIGS. 8A–8D show another alternate embodiment of the invention in which the shape of contacts 800 and the removal pattern of membrane 810 are different from the previously described embodiments. According to this embodiment, contact 800 is connected to membrane 810 via a structure comprising a ring 801 and bridge portion 802. FIG. 9 illustrates the interface between a BGA package 900 and the embodiment of FIGS. 8A–8D. As shown, ball contacts 902 connect with the individual contacts 800 each of which may then pivot about the associated bridge portion 802 of membrane 810 which connects the contact to the rest of the structure. That is, the independent movement of each contact 800 is provided by the flexibility of bridge portion 802 with respect to the plane of membrane 810.

It will be understood that the structure of FIGS. 6, 7 and 8 and other similar structures may be fabricated according to a variety of methods including the method described above and that the general idea of each of the structures is substantially the same. That is, the contacts are formed on the membrane with a sufficient freedom of movement (as a result of the pattern of removal of portions of the membrane and/or the structure of the contact itself) to allow substantially independent movement of each contact.

While the invention has been particularly shown and described with reference to specific embodiments thereof, it will be understood by those skilled in the art that changes in the form and details of the disclosed embodiments may be made without departing from the spirit or scope of the invention. For example, the invention has been described herein with reference to electroforming techniques for contact formation and etching or laser ablation of the support membrane for formation of the apertures. However, it will be understood that any number of other means of manufacture could result in essentially the same construct and would therefore remain within the scope of the invention. In addition, the function performed by the anisotropically conductive layer could be performed by other structures. Therefore, the scope of the present invention is not limited to apparatus and methods interfacing with or employing only anisotropically conductive layers. Therefore, the scope of the invention should be determined with reference to the appended claims.

What is claimed is:

1. An apparatus for providing electrical connection between a first array of contact points and a second array of contact points via a layer of anisotropically conductive material in contact with the second array of contact points, the apparatus comprising:

a membrane having a plurality of apertures therein for receiving the first array of contact points; and a plurality of electrical contacts, each of the electrical contacts being coupled to the membrane and at least partially in registration with one of the plurality of apertures, the electrical contacts being for contacting the first array of contact points through the plurality of apertures, the electrical contacts also being for electrically connecting to the second array of contact points via the layer of anisotropically conductive material, each of the electrical contacts being operable to move substantially independently of adjacent electrical contacts.

2. The apparatus of claim 1 wherein selected ones of the electrical contacts comprise a pressure concentrating structure which defines a contact interface with a corresponding one of the first array of contact points.

3. The apparatus of claim 2 wherein the structure defines a circular contact interface.

4. The apparatus of claim 1 wherein the first array of contact points comprises a ball grid array.

5. The apparatus of claim 1 wherein the first array of contact points are characterized by a distribution pattern, the apertures of the membrane and the electrical contacts also being characterized by the distribution pattern.

6. The apparatus of claim 1 wherein the apertures of the membrane are formed using a chemical etching technique.

7. The apparatus of claim 1 wherein the apertures of the membrane are formed using a laser ablation technique.

8. The apparatus of claim 1 wherein the membrane has a first thickness and the electrical contacts have a second thickness, a ratio between the first and second thicknesses being approximately 1.5:1.

9. The apparatus of claim 1 wherein the membrane comprises polyimide.

10. The apparatus of claim 1 wherein the electrical contacts comprise nickel-cobalt.

11. The apparatus of claim 1 wherein substantially independent movement of each electrical contact is realized via flexibility of a portion of each electrical contact.

12. The apparatus of claim 1 wherein substantially independent movement of each electrical contact is realized via flexibility of a portion of the membrane to which each electrical contact is connected.

13. A method for manufacturing an apparatus for providing electrical connection between a first array of contact points and a second array of contact points via a layer of anisotropically conductive material in contact with the second array of contact points, the method comprising:

providing a membrane;

forming electrical contacts coupled to the membrane, the electrical contacts being for electrically connecting to the second array of contact points via the layer of anisotropically conductive material; and forming apertures in the membrane in registration with at least a portion of each of the electrical contacts, the apertures for enabling the first array of contact points to contact the electrical contacts;

wherein each of the electrical contacts is operable to move substantially independently of adjacent electrical contacts.

14. The method of claim 13 further comprises the step of forming concave features in the membrane in locations where selected electrical contacts are to be formed, the concave features facilitating formation of corresponding pressure concentrating structures on the selected electrical contacts, the pressure concentrating structures defining contact interfaces with a corresponding ones of the first array of contact points.

15. The method of claim 13 wherein forming the apertures comprises chemically etching the membrane.

16. The method of claim 13 wherein forming the apertures comprises laser ablating the membrane.

17. The method of claim 13 wherein the membrane has a first thickness and the electrical contacts have a second thickness, a ratio between the first and second thicknesses being approximately 1.5:1.

18. A method for providing electrical connection between a first array of contact points and a second array of contact points via a layer of anisotropically conductive material in contact with the second array of contact points, the method comprising:

providing a contactor comprising a membrane having a plurality of apertures therein, and a plurality of electrical contacts coupled to the membrane, a portion of each electrical contact being in registration with one of the plurality of apertures, wherein each of the electrical contacts moves substantially independently of adjacent electrical contacts;

establishing contact between the plurality of electrical contacts and the layer of anisotropically conductive material;

aligning the first array of contact points with the plurality of apertures; and providing contact between the first array of contact points and the electrical contacts via the apertures, and thereby providing electrical connection between the first array of contact points and the second array of contact points via the layer of anisotropically conductive material.

* * * * *